(12) United States Patent
Nahm et al.

(10) Patent No.: US 10,950,781 B2
(45) Date of Patent: Mar. 16, 2021

(54) METHOD OF MANUFACTURING PIEZOELECTRIC THIN FILM AND PIEZOELECTRIC SENSOR MANUFACTURED USING PIEZOELECTRIC THIN FILM

(71) Applicant: Korea University Research and Business Foundation, Seoul (KR)

(72) Inventors: Sahn Nahm, Seoul (KR); Jong Hyun Kim, Seoul (KR); Sang Hyo Kweon, Ulsan (KR); Woong Hee Lee, Namyangju-si (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 16/528,761

(22) Filed: Aug. 1, 2019

(65) Prior Publication Data

US 2020/0052190 A1 Feb. 13, 2020

(30) Foreign Application Priority Data

Aug. 9, 2018 (KR) .................... 10-2018-0093289

(51) Int. Cl.
*H01L 41/08* (2006.01)
*H01L 41/316* (2013.01)
*H01L 41/047* (2006.01)
*H01L 41/187* (2006.01)

(52) U.S. Cl.
CPC .......... *H01L 41/316* (2013.01); *H01L 41/047* (2013.01); *H01L 41/0805* (2013.01); *H01L 41/1873* (2013.01)

(58) Field of Classification Search
CPC ................. H01L 41/047; H01L 41/0805; H01L 41/1873
See application file for complete search history.

(56) References Cited

U.S. PATENT DOCUMENTS

| 9,496,484 B2 | 11/2016 | Ueda et al. | |
| 2007/0069225 A1* | 3/2007 | Krames | H01L 21/2654 257/94 |
| 2011/0121689 A1* | 5/2011 | Grannen | H03H 9/02015 310/357 |

FOREIGN PATENT DOCUMENTS

| JP | 2013-144618 A | 7/2013 |
| JP | 2014-62032 A | 4/2014 |
| JP | 2018-82051 A | 5/2018 |

(Continued)

OTHER PUBLICATIONS

Korean Office Action dated Sep. 26, 2019 in counterpart Korean Patent Application No. 10-2018-0093289 (5 Pages in Korean).

*Primary Examiner* — Derek J Rosenau
(74) *Attorney, Agent, or Firm* — NSIP Law

(57) ABSTRACT

Disclosed are a method of manufacturing a piezoelectric thin film and a piezoelectric sensor manufactured using the piezoelectric thin film. A piezoelectric sensor according to an embodiment of the present disclosure includes a substrate; a lower electrode formed on the substrate; a two-dimensional perovskite nanosheet seed layer formed on the lower electrode; a ceramic piezoelectric thin film formed on the two-dimensional perovskite nanosheet seed layer; and an upper electrode formed on the ceramic piezoelectric thin film, wherein each of the two-dimensional perovskite nanosheet seed layer and the ceramic piezoelectric thin film has a crystal structure.

9 Claims, 5 Drawing Sheets

(56) References Cited

FOREIGN PATENT DOCUMENTS

| | | |
|---|---|---|
| KR | 10-1635939 B1 | 7/2016 |
| KR | 10-2016-0115768 A | 10/2016 |
| KR | 10-1738983 B1 | 5/2017 |

* cited by examiner

[FIG. 1]
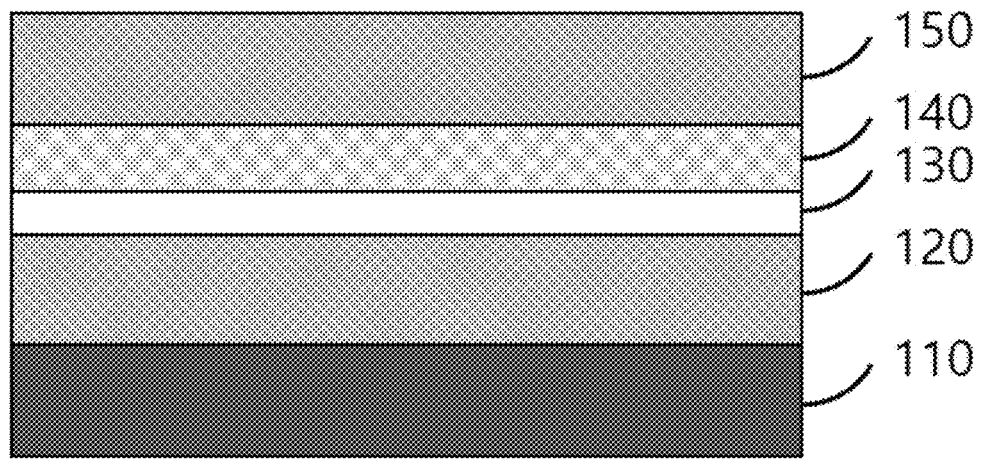
[FIG. 2]
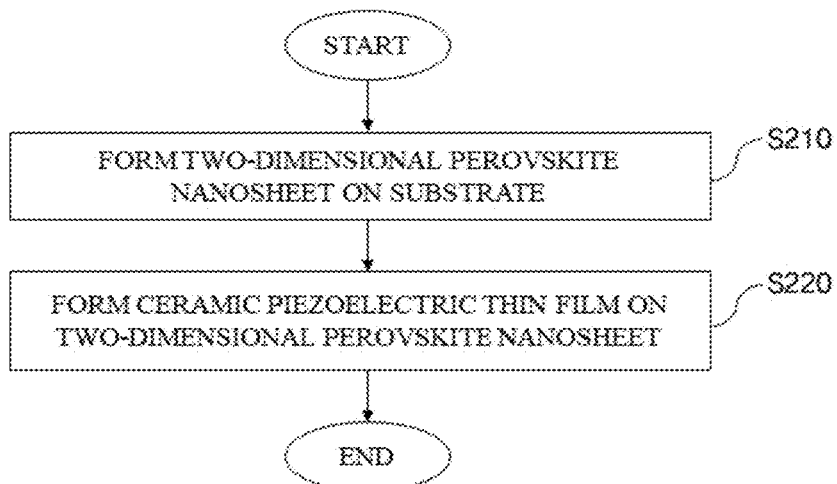

[FIG. 3]
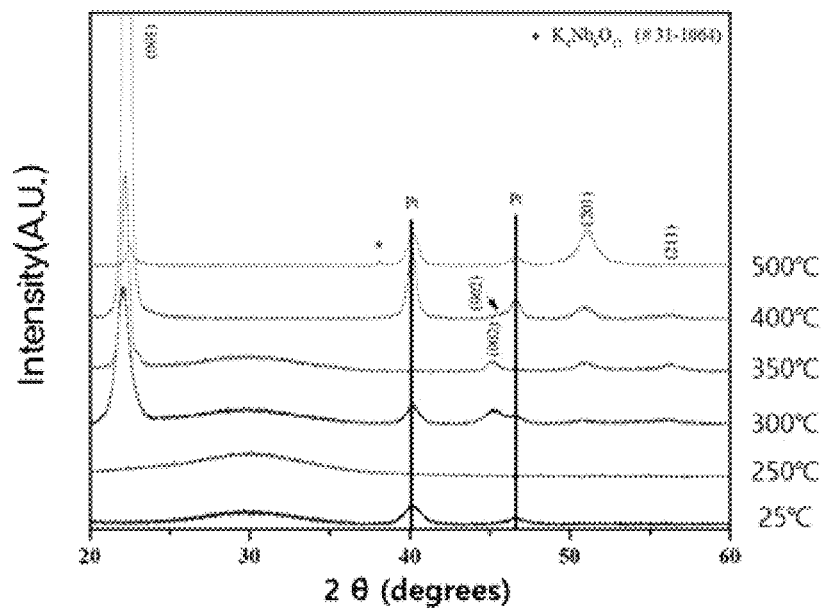
[FIG. 4]
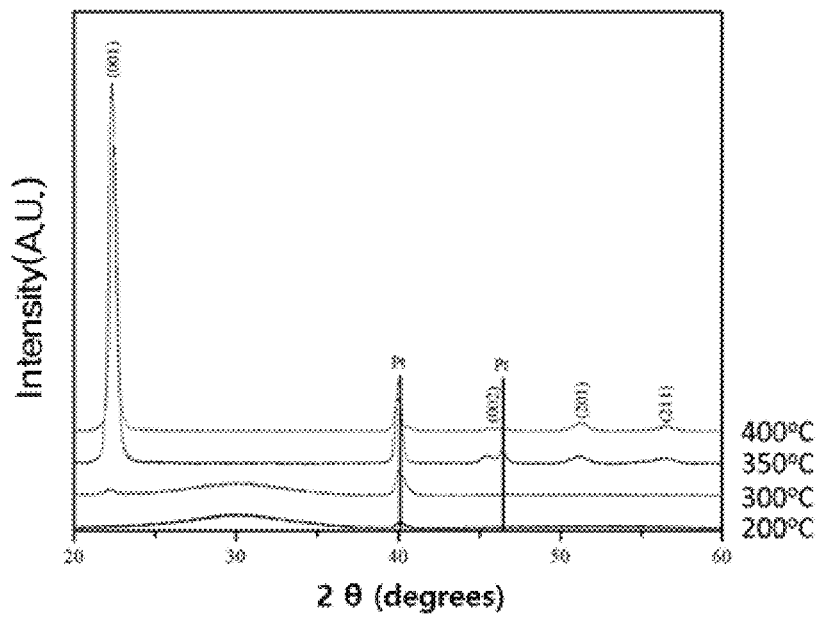

[FIG. 5]
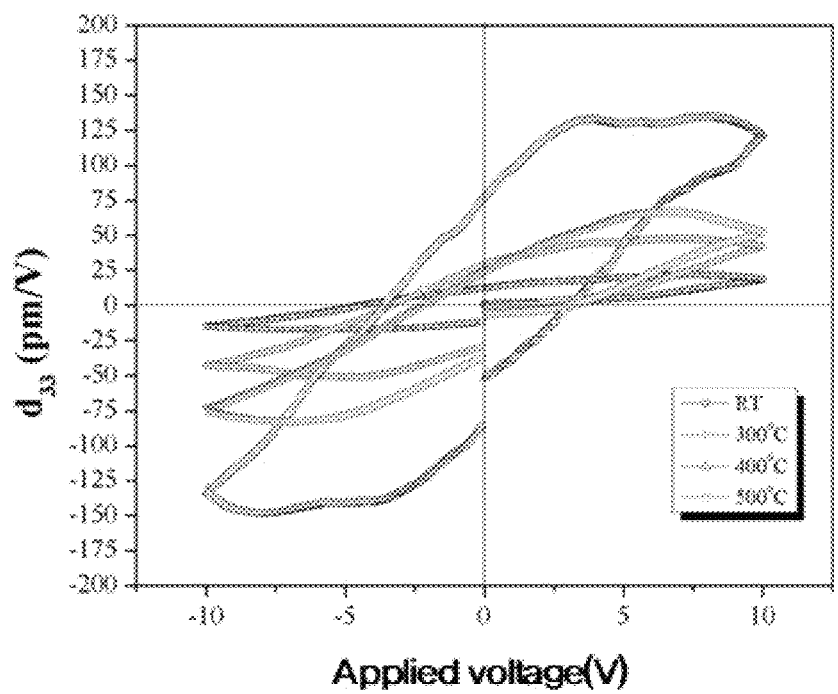
[FIG. 6]
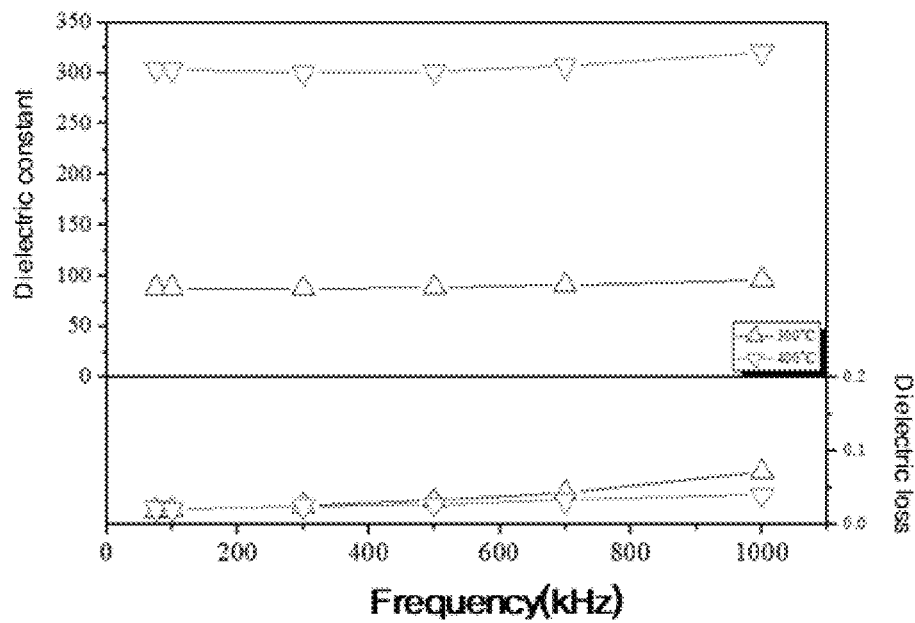

[FIG. 7A]
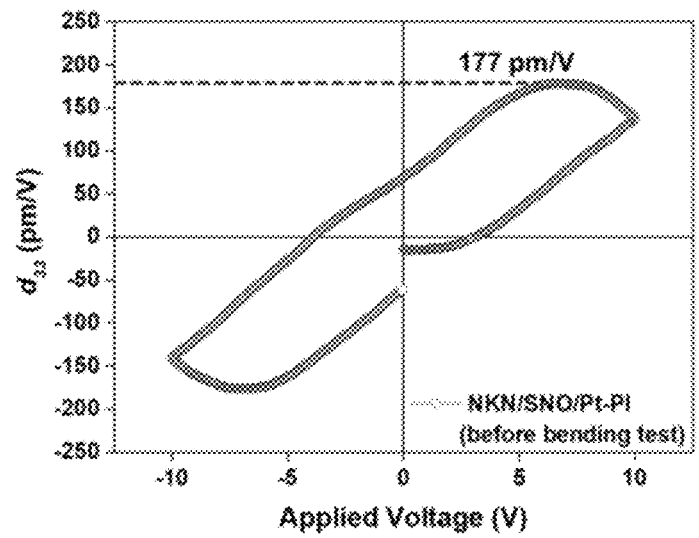
[FIG. 7B]
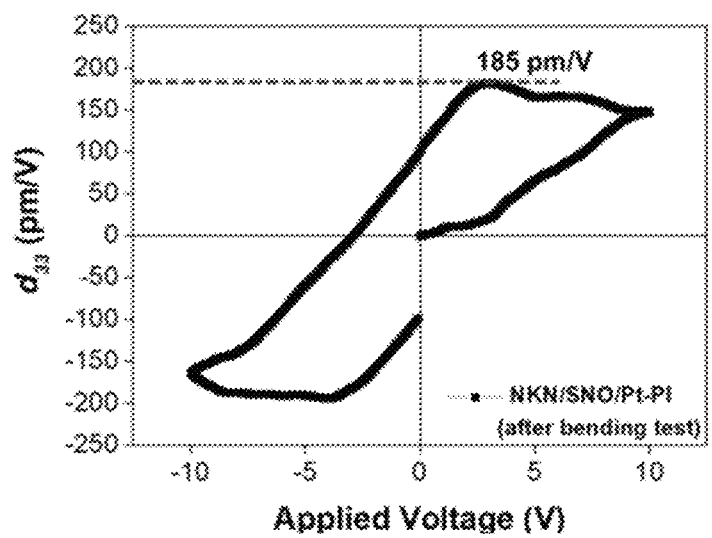

[FIG. 8]
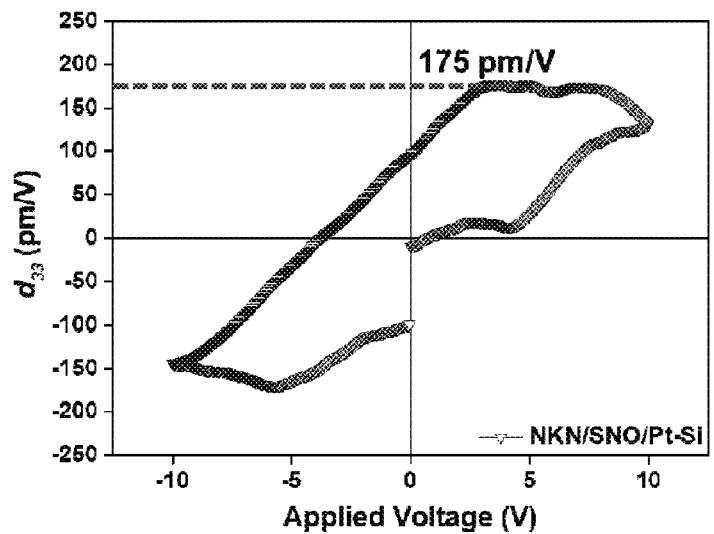
[FIG. 9]
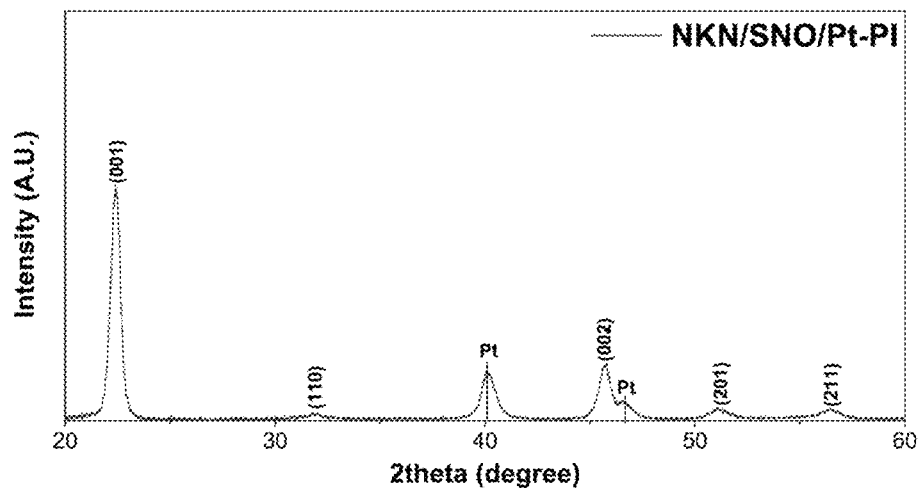

METHOD OF MANUFACTURING PIEZOELECTRIC THIN FILM AND PIEZOELECTRIC SENSOR MANUFACTURED USING PIEZOELECTRIC THIN FILM

This research was supported by the National Research Council of Science & Technology(NST) granted by the Korea government (MSIP) (No. CAP-17-04-KRISS).

CROSS-REFERENCE TO RELATED APPLICATION

This application claims priority to and the benefit of Korean Patent Application No. 10-2018-0093289, filed on Aug. 9, 2018, the disclosure of which is incorporated herein by reference in its entirety.

BACKGROUND

1. Field of the Invention

The present disclosure relates to a method of manufacturing a piezoelectric thin film and a piezoelectric sensor manufactured using the piezoelectric thin film, and more particularly, to a method of manufacturing a piezoelectric thin film oriented in a specific crystal direction and a piezoelectric sensor manufactured using the manufactured piezoelectric thin film.

2. Discussion of Related Art

A piezoelectric material, which has a characteristics of being capable of interconverting electrical energy and mechanical energy applied thereto, is being widely applied to ultrasonic devices, video devices, acoustic devices, sensors, and communication devices, and the like. In addition, a piezoelectric material is widely used as a material of essential components such as a piezoelectric transformer, an ultrasonic vibrator, an electromechanical ultrasonic transducer, an ultrasonic motor, an actuator, an ultrasonic generator, a haptic device, a vibration sensor, an energy harvester, and the like.

In particular, when a piezoelectric material is applied to a display panel, it can be utilized as a material of devices with various functions such as a pressure sensor, a haptic device, an energy harvester, and a speaker. For application to miniaturized and highly efficient display panels, existing piezoelectric materials are being applied in a thin film form. For this, various process technologies for a piezoelectric material composition such as Pb $(Zr,Ti)O_3$ (hereinafter referred to as PZT) and ZnO are being studied.

Most existing piezoelectric thin films are obtained through a thin film deposition process at a high temperature of 500° C. or more, or a post-heat treatment process at high temperature.

In such high-temperature processes, unique structures of piezoelectric thin films (e.g., a perovskite structure in the case of $(Ba,Sr)TiO_3$ or $(Na_xK_{1-x})NbO_3$) may be formed. The piezoelectric thin films have respective crystal structures, thereby having relatively high piezoelectric strain constants.

However, there are difficulties in applying a piezoelectric thin film to specific application fields such as a flexible element, a transparent element, and a display panel due to such high heat treatment temperature and deposition temperature.

Meanwhile, when a piezoelectric thin film is deposited at low temperature such as room temperature, thermal energy is insufficient, whereby crystallization due to diffusion of atoms and ions becomes difficult. Accordingly, the piezoelectric thin film mostly has an amorphous structure.

Such a piezoelectric thin film has relatively low piezoelectric characteristics, whereby it is difficult to anticipate application thereof to a display panel or various piezoelectric devices.

To address these problems, various processes of transferring a thin film manufactured at high temperature to a polymer substrate have been studied. However, the properties of a piezoelectric thin film were deteriorated due to film damage during a transfer process, and there is a limitation in applying such a complex process.

SUMMARY OF THE INVENTION

Therefore, the present disclosure has been made in view of the above problems, and it is an objective of the present disclosure to provide a method of manufacturing a piezoelectric thin film oriented in a specific crystal direction through a low-temperature process, and a piezoelectric sensor manufactured using the manufactured piezoelectric thin film.

In accordance with an aspect of the present disclosure, the above and other objects can be accomplished by the provision of a piezoelectric sensor including a substrate; a lower electrode formed on the substrate; a two-dimensional perovskite nanosheet seed layer formed on the lower electrode; a ceramic piezoelectric thin film formed on the two-dimensional perovskite nanosheet seed layer; and an upper electrode formed on the ceramic piezoelectric thin film, wherein each of the two-dimensional perovskite nanosheet seed layer and the ceramic piezoelectric thin film has a crystal structure.

In the piezoelectric sensor according to an embodiment of the present disclosure, a lattice parameter difference between the two-dimensional perovskite nanosheet seed layer and the ceramic piezoelectric thin film may be 0% to 20%.

In the piezoelectric sensor according to an embodiment of the present disclosure, a material of the lower electrode material and a material of the upper electrode may be at least one selected from the group consisting of platinum (Pt), gold (Au), palladium (Pd), copper (Cu), nickel (Ni), chromium (Cr), molybdenum (Mo), aluminum (Al), a conductive carbon tape, and a transparent conductive oxide.

In accordance with another aspect of the present disclosure, there is provided A method of manufacturing a piezoelectric thin film, the method including forming a two-dimensional perovskite nanosheet seed layer on a substrate; and forming a ceramic piezoelectric thin film on the two-dimensional perovskite nanosheet seed layer, wherein each of the two-dimensional perovskite nanosheet seed layer and the ceramic piezoelectric thin film has a crystal structure.

In the method of manufacturing a piezoelectric thin film according to another embodiment of the present disclosure, a lattice parameter difference between the two-dimensional perovskite nanosheet seed layer and the ceramic piezoelectric thin film may be 0% to 20%.

In the forming of the two-dimensional perovskite nanosheet seed layer of the method of manufacturing a piezoelectric thin film according to another embodiment of the present disclosure, the two-dimensional perovskite nanosheet seed layer may be formed through a Langmuir- Blodgett process using a two-dimensional perovskite nanosheet colloid on the substrate.

In the forming of the ceramic piezoelectric thin film of the method of manufacturing a piezoelectric thin film according to another embodiment of the present disclosure, the ceramic piezoelectric thin film may be formed through a physical vapor deposition (PVD) process using a ceramic target on the two-dimensional perovskite nanosheet seed layer.

In the method of manufacturing a piezoelectric thin film according to another embodiment of the present disclosure, the ceramic target may include a material having a composition of $(Na_xK_yLi_{1-x-y})(Nb_zSb_{1-z})O_3$, wherein $0<x<1$, $0<y<1$, $0<x+y\leq1$, and $0<z\leq1$.

In the method of manufacturing a piezoelectric thin film according to another embodiment of the present disclosure, a physical vapor deposition process of forming the ceramic piezoelectric thin film may be performed at 200° C. to 600° C.

In the method of manufacturing a piezoelectric thin film according to another embodiment of the present disclosure, a material of the two-dimensional perovskite nanosheet seed layer may be at least one selected from the group consisting of $TiO_2$, $Ti_{0.91}O_2$, $Ti_{0.87}O_2$, $Ti_3O_7$, $Ti_4O_9$, $Ti_5O_{11}$, $MnO_2$, $Mn_3O_7$, $Nb_3O_8$, $Nb_6O_{17}$, $LaNb_2O_7$, $La_{0.90}Eu_{0.05}Nb_2O_7$, $Eu_{0.56}Ta_2O_7$, $SrTa_2O_7$, $Bi_2SrTa_2O_9$, $Ca_2Nb_3O_{10}$, $Sr_2Nb_3O_{10}$, $NaCaTa_3O_{10}$, $CaLaNb_2TiO_{10}$, $La_2Ti_2NbO_{10}$, $Ba_5Ta_4O_{15}$, $W_2O_7$, $RuO_{2.1}$, $Cs_4W_{11}O_{36}$, $TaO_3$, $TiNbO_5$, $Ti_2NbO_7$, and $TiTaO_5$.

In the method of manufacturing a piezoelectric thin film according to another embodiment of the present disclosure, a material of the substrate may include at least one selected from among polyimide, polycarbonate, silicon, and glass.

In accordance with yet another aspect of the present disclosure, there is provided a piezoelectric thin film prepared by the method.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which:

FIG. 1 illustrates a sectional view of a piezoelectric sensor according to an embodiment of the present disclosure;

FIG. 2 illustrates a flowchart of a method of preparing a piezoelectric thin film according to another embodiment of the present disclosure;

FIG. 3 illustrates X-ray diffraction (XRD) graphs of NKN piezoelectric thin films according to Examples 1 to 4 and Comparative Examples 1 and 2 of the present disclosure for analyzing crystal structures thereof;

FIG. 4 illustrates XRD graphs of NKN piezoelectric thin films according to Examples 5 and 6 and Comparative Examples 3 and 4 of the present disclosure for analyzing crystal structures thereof;

FIG. 5 illustrates a piezoelectric strain constant ($d_{33}$) of an NKN piezoelectric thin film, prepared according to a process condition of each of Examples 1, 3, and 4 and Comparative Example 1 of the present disclosure, measured using a piezoelectric force microscopy (PFM);

FIG. 6 illustrates a dielectric constant and a dielectric loss of an NKN piezoelectric thin film prepared according to a process condition of each of Examples 1 and 3 of the present disclosure;

FIGS. 7A and 7B illustrate piezoelectric constants of an NKN piezoelectric thin film, prepared according to a process condition of Example 1 of the present disclosure, before and after bending;

FIG. 8 illustrates a piezoelectric characteristic of an NKN piezoelectric thin film prepared according to a process condition of Example 7 of the present disclosure; and FIG. 9 illustrates an XRD analysis result of an NKN piezoelectric thin film prepared according to a process condition of Example 7 of the present disclosure.

DETAILED DESCRIPTION OF EXEMPLARY EMBODIMENTS

The present disclosure will now be described more fully with reference to the accompanying drawings and contents disclosed in the drawings. However, the present disclosure should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present disclosure, and it should be understood that the terms are exemplified to describe embodiments of the present disclosure.

Also, some of the terms used herein may be arbitrarily chosen by the present applicant. In this case, these terms are defined in detail below. Accordingly, the specific terms used herein should be understood based on the unique meanings thereof and the whole context of the present disclosure.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, in the following description of the present disclosure, a detailed description of known functions and configurations incorporated herein will be omitted when it may make the subject matter of the present disclosure unclear. The terms used in the specification are defined in consideration of functions used in the present disclosure, and can be changed according to the intent or conventionally used methods of clients, operators, and users. Accordingly, definitions of the terms should be understood on the basis of the entire description of the present specification.

Hereinafter, embodiments of the present disclosure are more fully described with reference to the accompanying drawings.

FIG. 1 illustrates a sectional view of a piezoelectric sensor according to an embodiment of the present disclosure.

Referring to FIG. 1, a piezoelectric sensor 100 according to an embodiment of the present disclosure includes a substrate 110, a lower electrode 120 formed on the substrate, a two-dimensional perovskite nanosheet seed layer 130 formed on the lower electrode 120, a ceramic piezoelectric thin film 140 formed on the two-dimensional perovskite nanosheet seed layer 130, and an upper electrode 150 formed on the ceramic piezoelectric thin film 140.

The substrate 110 may be a rigid substrate such as a silicon substrate and a glass substrate.

In addition, the substrate 110 may be a polymer substrate such as a polyimide substrate or a polycarbonate substrate. The polymer substrate may be a flexible substrate. When such polymer substrates are used, a flexible device may be formed.

In the case of conventional piezoelectric thin film preparation processes, heat treatment and deposition at a high temperature of 600° C. or higher are necessary during the preparation process so as to prepare a piezoelectric thin film oriented in a specific crystal direction, whereby there are difficulties in forming a piezoelectric thin film on a polymer substrate such as a polyimide substrate or a polycarbonate substrate.

This is because heat treatment and deposition processes cannot be performed when a process temperature is higher than a transition temperature of a material constituting a substrate.

However, in the case of the piezoelectric sensor 100 according to an embodiment of the present disclosure, a temperature during preparation of a piezoelectric thin film is relatively low compared to a temperature of a conventional piezoelectric thin film preparation process, whereby a piezoelectric thin film oriented in a specific crystal direction may be formed even on a polymer substrate such as a polyimide substrate or a polycarbonate substrate.

The lower electrode 120 may be formed on the substrate 110, and a material of the lower electrode 120 may be at least one selected from the group consisting of platinum (Pt), gold (Au), palladium (Pd), copper (Cu), nickel (Ni), chromium (Cr), molybdenum (Mo), aluminum (Al), a conductive carbon tape, and a transparent conductive oxide.

The two-dimensional perovskite nanosheet seed layer 130 may be formed on the lower electrode 120. The two-dimensional perovskite nanosheet seed layer 130 may be formed to have a specific crystal orientation by a Langmuir-Blodgett process, a layer-by-layer (LBL) process, and electrophoresis, or the like.

A Langmuir-Blodgett process allows formation of a nanosheet at a low temperature of 20° C. to 50° C., whereby a thin film may be directly deposited also on a polymer substrate sensitive to a temperature condition such as a polyimide film.

The two-dimensional perovskite nanosheet seed layer 130 may be oriented and formed in a specific crystal lattice form.

The two-dimensional perovskite nanosheet seed layer 130 oriented in a specific crystal lattice form affects a crystal lattice orientation of the ceramic piezoelectric thin film 140.

This is because the two-dimensional perovskite nanosheet seed layer 130 is formed using a nanosheet colloid prepared by peeling off layers with a specific crystal plane of a layered material one by one by acid treatment and treatment with a polymer solvent.

The process of forming the two-dimensional perovskite nanosheet seed layer 130 using the nanosheet colloid will be particularly described in description sections of a flowchart of FIG. 2 and Example 1 below.

The ceramic piezoelectric thin film 140 is formed on the two-dimensional perovskite nanosheet seed layer 130.

The ceramic piezoelectric thin film 140 may be formed through a physical vapor deposition process.

The physical vapor deposition process may include a pulsed laser deposition (PLD) process or a sputtering process.

When the ceramic piezoelectric thin film 140 is formed through a physical vapor deposition process, it may be formed in a large area even under a low temperature condition of 200° C. to 600° C.

Since the temperature condition of the physical vapor deposition process is also lower than the transition temperature of the substrate as described above, the ceramic piezoelectric thin film 140 may be formed on a polymer substrate such as a polyimide substrate or a polycarbonate substrate.

Here, a lattice parameter difference between a crystal lattice of the two-dimensional perovskite nanosheet seed layer 130 and a crystal lattice of the ceramic piezoelectric thin film 140 may be 0% to 20%.

A regular lattice structure of atoms or ions constituting a crystal is called a crystal lattice. Here, a repeated regular spatial arrangement in a material is called a unit lattice, and the size and angle of a crystal axis of the unit lattice are called lattice parameters.

That is, it can be confirmed that a crystal lattice of the two-dimensional perovskite nanosheet seed layer 130 may be the same as or slightly different from a crystal lattice of the ceramic piezoelectric thin film 140, and the crystal lattice of the ceramic piezoelectric thin film 140 is determined according to the crystal lattice of the two-dimensional perovskite nanosheet seed layer 130.

The crystal lattice of the two-dimensional perovskite nanosheet seed layer 130 and the crystal lattice of the ceramic piezoelectric thin film 140 may be oriented in a direction of [001], but the present disclosure is not limited thereto. In addition, the crystal lattice of the two-dimensional perovskite nanosheet seed layer 130 may be oriented in plane directions, i.e., [110] and [111] directions, of a thin film material having a lattice structure most similar to a lattice structure of the two-dimensional perovskite nanosheet seed layer 130 depending upon a material type of the ceramic piezoelectric thin film 140.

Here, a material having a crystal lattice size similar to a crystal lattice size of the ceramic piezoelectric thin film 140 as described above is selected as a material of the two-dimensional perovskite nanosheet seed layer 130, and the ceramic piezoelectric thin film 140 is formed after first forming the two-dimensional perovskite nanosheet seed layer 130, whereby the ceramic piezoelectric thin film 140 may be formed to have a desired crystal lattice at a low temperature.

The upper electrode 150 may be formed on the ceramic piezoelectric thin film 140, and may be formed using a material the same as the material of the lower electrode 120 described above.

Accordingly, the piezoelectric sensor according to an embodiment of the present disclosure includes a substrate with a low transition temperature; and a piezoelectric thin film, which has high piezoelectric characteristics and a perovskite crystal structure oriented in a specific direction, formed on the substrate. Since an excellent piezoelectric charge constant of an excellent piezoelectric thin film is proportional to the g constant determining sensitivity of a sensor, the piezoelectric sensor may exhibit excellent characteristics.

In addition, since, in the case of the piezoelectric thin film according to the embodiment of the present disclosure, perovskite elements do not volatilize during a deposition process and a heat treatment process, excellent characteristics may be exhibited.

FIG. 2 illustrates a flowchart of a method of preparing a piezoelectric thin film according to another embodiment of the present disclosure.

Referring to FIG. 2, the method of manufacturing a piezoelectric thin film according to another embodiment of the present disclosure includes a step (S210) of forming a two-dimensional perovskite nanosheet seed layer on a substrate; and a step (S220) of forming a ceramic piezoelectric thin film on the two-dimensional perovskite nanosheet seed layer.

In the step (S210) of forming a two-dimensional perovskite nanosheet seed layer on a substrate, a substrate is first mounted on a chuck in a process chamber, and then a two-dimensional perovskite nanosheet seed layer is formed on the substrate.

Here, the substrate may be a rigid substrate such as a silicon substrate or a glass substrate.

In addition, the substrate may be a polymer substrate such as a polyimide substrate or a polycarbonate substrate. The polymer substrate may be a flexible substrate.

The two-dimensional perovskite nanosheet seed layer is formed on the substrate. A material of the two-dimensional perovskite nanosheet seed layer may be selected from among $TiO_2$, $Ti_{0.91}O_2$, $Ti_{0.87}O_2$, $Ti_3O_7$, $Ti_4O_9$, $Ti_5O_{11}$, $MnO_2$, $Mn_3O_7$, $Nb_3O_8$, $Nb_6O_{17}$, $LaNb_2O_7$, $La_{0.90}Eu_{0.05}Nb_2O_7$, $Eu_{0.56}Ta_2O_7$, $SrTa_2O_7$, $Bi_2SrTa_2O_9$, $Ca_2Nb_3O_{10}$, $Sr_2Nb_3O_{10}$, $NaCaTa_3O_{10}$, $CaLaNb_2TiO_{10}$, $La_2Ti_2NbO_{10}$, $Ba_5Ta_4O_{15}$, $W_2O_7$, $RuO_{2.1}$, $Cs_4W_{11}O_{36}$, $TaO_3$, $TiNbO_5$, $Ti_2NbO_7$, and $TiTaO_5$.

More preferably, the two-dimensional perovskite nanosheet seed layer may be any one of $Ca_2Nb_3O_{10}$ and $Sr_2Nb_3O_{10}$.

The two-dimensional perovskite nanosheet seed layer may be formed through a Langmuir-Blodgett process, a layer-by-layer (LBL) process, and electrophoresis.

A Langmuir-Blodgett process, which is a process of physically depositing a desired material on a substrate using surface tension of a material, allows easy production of a film with a uniform large area at room temperature.

In addition, since the Langmuir-Blodgett process allows formation of a nanosheet even at a low temperature of 20° C. to 50° C., a thin film may be directly deposited even on a polymer substrate sensitive to a temperature condition such as a polyimide film.

Accordingly, a piezoelectric thin film may be formed on a polymer substrate, thereby being applied to various fields such as a display panel formed of a flexible device or a transparent device.

Further, since a nanosheet may be formed, without a transfer process of transferring to a desired polymer substrate, after depositing a material on a silicon substrate, damage of a piezoelectric thin film and deterioration in the properties thereof due to a transfer process may be prevented, and a process may be simplified.

More particularly, the step (S210) of forming a two-dimensional perovskite nanosheet seed layer includes a step of preparing a two-dimensional perovskite nanosheet colloid; and a step of forming a two-dimensional perovskite nanosheet seed layer using the two-dimensional perovskite nanosheet colloid.

The step of preparing a two-dimensional perovskite nanosheet colloid includes a step of forming, in a colloidal state, a two-dimensional perovskite nanosheet material to be formed on a substrate.

The step of forming a two-dimensional perovskite nanosheet seed layer includes a process of forming a two-dimensional perovskite nanosheet seed layer on a substrate through a Langmuir-Blodgett process using the two-dimensional perovskite nanosheet colloid.

In the step (S220) of forming a ceramic piezoelectric thin film on the two-dimensional perovskite nanosheet seed layer according to an embodiment of the present disclosure, a substrate, on which a nanosheet has been formed, is transferred into a chamber for a physical vapor deposition process (PVD).

The physical vapor deposition process may include a pulsed laser deposition (PLD) process or a sputtering process.

When the ceramic piezoelectric thin film is formed through a physical vapor deposition process, the ceramic piezoelectric thin film may be formed to have a large area under a low temperature condition of 200° C. to 400° C.

The temperature of the physical vapor deposition process is also lower than the temperature of a conventional piezoelectric thin film preparation process as in the temperature condition of the step of forming a two-dimensional perovskite nanosheet seed layer described above, whereby a piezoelectric thin film oriented in a specific crystal direction according to an embodiment of the present disclosure may be formed on a polymer substrate such as a polyimide substrate or a polycarbonate substrate.

In addition, alkali metals, such as sodium (Na) and potassium (K), of elements constituting a perovskite thin film derive from a perovskite structure and volatilize at a high temperature of 800° C. or higher. However, the low temperature process of the present disclosure prevents volatilization of the perovskite material.

More particularly, the step (S220) of forming a ceramic piezoelectric thin film on the two-dimensional perovskite nanosheet seed layer includes a step of forming a ceramic target; and a step of depositing a ceramic piezoelectric thin film.

The step of forming a ceramic target includes a process of forming a ceramic target having the composition of a ceramic piezoelectric thin film to be formed on a two-dimensional perovskite nanosheet seed layer.

In the method of manufacturing a piezoelectric thin film according to an embodiment of the present disclosure, the ceramic target may include a material having a composition of $(Na_xK_yLi_{1-x-y})(Nb_zSb_{1-z})O_3$, wherein $0<x<1$, $0<y<1$, $0<x+y\le1$, and $0<z\le1$.

In addition, the ceramic target may further include an oxide along with the material having a composition of $(Na_xK_yLi_{1-x-y})(Nb_zSb_{1-z})O_3$. The oxide may be any one selected from among $CaTiO_3$, $BaTiO_3$, $SrTiO_3$, $BaZrO_3$, $CaZrO_3$, and $SrZrO_3$.

The step of depositing a ceramic piezoelectric thin film includes a process of depositing a ceramic piezoelectric thin film by physical vapor deposition using the ceramic target prepared by the step of forming a ceramic target.

Hereinafter, the present disclosure will be described in more detail with reference to the following Examples. It will be apparent to those skilled in the art that the Examples are merely for concretely explaining the disclosure and therefore, there is no intent to limit the disclosure to the Examples.

Example 1

(Preparation of Two-Dimensional Nanosheet Colloid)

Potassium carbonate ($K_2CO_3$), calcium carbonate ($CaCO_3$), and niobium oxide ($Nb_2O_5$) were mixed in a mole ratio of 0.5:2:1.5, thereby preparing 20 g of a mixture.

The mixture was wet-mixed in 35 ml of ethanol, and then pulverized for 24 hours by a primary ball milling process, followed by being subjected to a primary drying process of drying a solvent used in the wet mixing for 3 hours to produce a powder.

Next, the dried powder was calcinated at 1000° C. for 10 hours.

20 g of the calcinated oxide powder was wet-mixed in 35 ml of ethanol, followed by being pulverized by a secondary ball milling process. Next, a solvent used in the wet mixing was dried to prepare a powder, followed by drying for 3 hours.

Next, a sieving process of sieving the powder to a uniform particle size; a molding process of forming the powder into a pellet-shaped molded product; and a sintering process of sintering the pellet-shaped molded product at 1375° C. for 10 hours were performed.

The sintered powder was mixed with a mixture of hydrochloric acid at a concentration of 2.0 M and water, whereby K of $KCa_2Nb_3O_{10}$ was substituted with H.

The substituted powder ($HCa_2Nb_3O_{10}$) was subjected to a filtering process of washing with water, and then dried. The dried powder ($HCa_2Nb_3O_{10}$) was subjected to a peeling process of adding to a mixture of a tetrabutylammonium hydroxide solution and water (tetrabutylammonium (TBA+):H+=1:1) to convert the powder into a nanosheet.

After one week of peeling, the solution was centrifuged to prepare a two-dimensional nanosheet colloid capable of depositing $Ca_2Nb_3O_{10}$.

(Formation of Two-Dimensional Nanosheet)

The prepared $Ca_2Nb_3O_{10}$ nanosheet colloid was floated in water, and a nanosheet was formed on a silicon substrate by a Langmuir-Blodgett process.

After forming the nanosheet on the silicon substrate, heat treatment was performed at 400° C. for 30 minutes to decompose tetrabutylammonium (TBA+) present in the nanosheet.

(Preparation of Ceramic Target)

Potassium carbonate ($K_2CO_3$), sodium carbonate ($Na_2CO_3$), and niobium oxide ($Nb_2O_5$), as primary materials, were mixed in a mole ratio of 1:1:2 to prepare a mixture.

100 g of the mixture was wet-mixed in 150 ml of ethanol, followed by performing a primary ball milling process for 24 hours.

After the primary ball milling process, a primary drying process of drying a solvent was performed for 3 hours to prepare a powder. Next, the powder was calcinated at 950° C. for 3 hours, thereby producing an oxide powder having a composition of $(Na_{0.5}K_{0.5})NbO_3$.

100 g of the calcinated oxide powder was wet-mixed in 150 ml of ethanol once again, followed by performing a secondary ball milling process of pulverizing for 72 hours and a secondary drying process of drying a solvent used in the wet mixing to produce a powder for 6 hours.

Next, a sieving process of sieving the powder to a uniform particle size was performed, and the sieved powder with the uniform particle size was pressed to have a size of 3 inches and a circular shape to form a molded product.

Finally, the molded product was sintered at 1070° C. for 2 hours, thereby preparing a ceramic target having a composition of $(Na_{0.5}K_{0.5})NbO_3$.

(Formation of Ceramic Piezoelectric Thin Film)

Using the ceramic target prepared in the ceramic target preparation step, a ceramic piezoelectric thin film having a composition of $(Na_{0.5}K_{0.5})NbO_3$ (hereinafter referred to as "NKN") was formed on a substrate including a nanosheet thereon by a physical vapor deposition process.

The ceramic piezoelectric thin film was deposited under physical vapor deposition conditions as follows: a composition ratio of Ar:O2, as process gases, was maintained at 4:1 under an oxygen partial pressure of 10 mTorr, the power was 100 W, and the temperature was 300° C.

Example 2

An experiment was performed in the same manner as in Example 1, except that the temperature of the physical vapor deposition process was changed to 350° C.

Example 3

An experiment was performed in the same manner as in Example 1, except that the temperature of the physical vapor deposition process was changed to 400° C.

Example 4

An experiment was performed in the same manner as in Example 1, except that the temperature of the physical vapor deposition process was changed to 500° C.

Example 5

An experiment was performed in the same manner as in Example 1, except that a polyimide substrate was used as a substrate and the temperature of the physical vapor deposition process was changed to 350° C.

Example 6

An experiment was performed in the same manner as in Example 1, except that a polyimide substrate was used as a substrate and the temperature of the physical vapor deposition process was changed to 400° C.

Example 7

An experiment was performed in the same manner as in Example 1, except that $Sr_2Nb_3O_{10}$ was used as a material of the two-dimensional perovskite nanosheet seed layer.

Comparative Example 1

An experiment was performed in the same manner as in Example 1, except that the temperature of the physical vapor deposition process was changed to 25° C.

Comparative Example 2

An experiment was performed in the same manner as in Example 1, except that the temperature of the physical vapor deposition process was changed to 250° C.

Comparative Example 3

An experiment was performed in the same manner as in Example 1, except that a polyimide substrate was used as a substrate and the temperature of the physical vapor deposition process was changed to 200° C.

Comparative Example 4

An experiment was performed in the same manner as in Example 1, except that a polyimide substrate was used as a substrate.

Hereinafter, the characteristics of the piezoelectric sensors according to the examples and the comparative examples of the present disclosure are described in detail with reference to the accompanying drawings.

FIG. 3 illustrates X-ray diffraction (XRD) graphs of NKN piezoelectric thin films according to Examples 1 to 4 and Comparative Examples 1 and 2 of the present disclosure for analyzing crystal structures thereof.

Referring to FIG. 3, it can be confirmed that, under the process conditions, such as 300° C., 350° C., 400° C. and 500° C., of Examples 1 to 4 of the present disclosure, the crystal structures of the NKN thin films are oriented in a specific crystal direction of [001].

On the other hand, it can be confirmed that, under the process conditions, such as 25° C. and 250° C., of Comparative Examples 1 and 2, the NKN piezoelectric thin films are not oriented in a [001] direction.

FIG. 4 illustrates XRD graphs of NKN piezoelectric thin films according to Examples 5 and 6 and Comparative Examples 3 and 4 of the present disclosure for analyzing crystal structures thereof.

Referring to FIG. 4, it can be confirmed that, under the process conditions, such as 350° C. and 400° C., of Examples 5 and 6 of the present disclosure, the crystal structures of the NKN thin films are oriented in a specific crystal direction of [001].

On the other hand, it can be confirmed that, under the process conditions, such as 200° C. and 300° C., of Comparative Examples 3 and 4, the crystal structures of the NKN thin films are not oriented in a [001] direction.

FIG. 5 illustrates a piezoelectric strain constant ($d_{33}$) of an NKN piezoelectric thin film, prepared according to a process condition of each of Examples 1, 3, and 4 and Comparative Example 1 of the present disclosure, measured using piezoelectric force microscopy (PFM).

Referring to FIG. 5, a highest piezoelectric strain constant of about 140 pC/N is confirmed when deposited at 400° C., and a piezoelectric strain constant of about 50 pC/N is confirmed also when deposited at a lower temperature of 300° C.

FIG. 6 illustrates a dielectric constant and a dielectric loss of an NKN piezoelectric thin film prepared according to a process condition of each of Examples 1 and 3 of the present disclosure.

Referring to FIG. 6, the piezoelectric thin film deposited at 400° C. exhibits a high dielectric constant of about 300. In addition, it can be confirmed that the dielectric constant of the piezoelectric thin film deposited at 300° C. is about 90 which is higher than the dielectric constant of the NKN piezoelectric thin film excluding a seed layer and deposited at the same temperature.

FIGS. 7A and 7B illustrate piezoelectric constants of an NKN piezoelectric thin film, prepared according to a process condition of Example 1 of the present disclosure, before and after bending.

Referring to FIGS. 7A and 7B, it can be confirmed that a piezoelectric constant is 177 pm/V before bending the NKN piezoelectric thin film, but the piezoelectric constant is 185 pm/V after bending the NKN piezoelectric thin film.

Accordingly, excellent piezoelectric characteristics of the NKN piezoelectric thin film may be maintained even when the NKN piezoelectric thin film is bent. Therefore, the piezoelectric thin film according to the embodiment of the present disclosure may be utilized as a flexible device.

FIG. 8 illustrates a piezoelectric characteristic of an NKN piezoelectric thin film prepared according to a process condition of Example 7 of the present disclosure.

Referring to FIG. 8, it can be confirmed that the NKN piezoelectric thin film according to Example 7 has a piezoelectric constant of 175 pm/V.

Accordingly, the piezoelectric thin film according to the embodiment of the present disclosure may exhibit excellent piezoelectric characteristics also when the two-dimensional perovskite nanosheet seed layer having a composition of $Sr_2Nb_3O_{10}$ is applied.

FIG. 9 illustrates an XRD analysis result of an NKN piezoelectric thin film prepared according to a process condition of Example 7 of the present disclosure.

Referring to FIG. 9, it can be confirmed that the NKN piezoelectric thin film may be directly deposited also on a polymer substrate.

Accordingly, since the piezoelectric thin film according to the embodiment of the present disclosure may be directly deposited also on a polymer substrate, it may be utilized as a flexible device.

As apparent from the above description, an embodiment of the present disclosure provides a method of preparing a piezoelectric thin film, which has high piezoelectric characteristics and a perovskite crystal structure oriented in a specific direction, formed on a substrate with a low transition temperature by a low temperature process.

Another embodiment of the present disclosure provides a method of preparing a piezoelectric thin film having a perovskite crystal structure, wherein volatilization of perovskite elements of the piezoelectric thin film does not occur during a deposition process and a heat treatment process.

Still another embodiment of the present disclosure provides a flexible piezoelectric sensor applicable to a display panel, such as a flexible device or a transparent device, and the like.

Meanwhile, embodiments of the present disclosure disclosed in the present specification and drawings are only provided to help understanding of the present disclosure and the scope of the present disclosure is not limited to the embodiments. It will be apparent to those skilled in the art that various modifications can be made to the above-described exemplary embodiments of the present disclosure without departing from the spirit or scope of the disclosure.

What is claimed is:

1. A piezoelectric sensor, comprising:
a substrate;
a lower electrode formed on the substrate;
a two-dimensional perovskite nanosheet seed layer formed on the lower electrode;
a ceramic piezoelectric thin film formed on the two-dimensional perovskite nanosheet seed layer; and
an upper electrode formed on the ceramic piezoelectric thin film,
wherein each of the two-dimensional perovskite nanosheet seed layer and the ceramic piezoelectric thin film has a crystal structure, and
wherein the ceramic piezoelectric thin film is a film of $(Na_{0.5}K_{0.5})NbO_3$.

2. The piezoelectric sensor according to claim 1, wherein a lattice parameter difference between the two-dimensional perovskite nanosheet seed layer and the ceramic piezoelectric thin film is 0% to 20%.

3. The piezoelectric sensor according to claim 1, wherein a material of the lower electrode material and a material of the upper electrode are at least one selected from the group consisting of platinum (Pt), gold (Au), palladium (Pd), copper (Cu), nickel (Ni), chromium (Cr), molybdenum (Mo), aluminum (Al), a conductive carbon tape, and a transparent conductive oxide.

4. The piezoelectric sensor according to claim 1, wherein the two-dimensional perovskite nanosheet seed layer is a layer of a material selected from the group consisting of at least one selected from the group consisting of $MnO_2$, $Mn_3O_7$, $LaNb_2O_7$, $La_{0.90}Eu_{0.05}Nb_2O_7$, $Eu_{0.56}Ta_2O_7$, $SrTa_2O_7$, $Bi_2SrTa_2O_9$, $Ca_2Nb_3O_{10}$, $Sr_2Nb_3O_{10}$, $NaCaTa_3O_{10}$, $CaLaNb_2TiO_{10}$, $La_2Ti_2NbO_{10}$, $Ba_5Ta_4O_{15}$, $W_2O_7$, $RuO_{2.1}$, $Cs_4W_{11}O_{36}$, $TiNbO_5$, $Ti_2NbO_7$, and $TiTaO_5$.

5. The piezoelectric sensor according to claim 1, wherein the two-dimensional perovskite nanosheet seed layer is a layer of $Ca_2Nb_3O_{10}$ or $Sr_2Nb_3O_{10}$.

6. The piezoelectric sensor according to claim 1, wherein the two-dimensional perovskite nanosheet seed layer is a layer of $Ca_2Nb_3O_{10}$.

7. A piezoelectric sensor, comprising:
a substrate;
a lower electrode formed on the substrate;
a two-dimensional perovskite nanosheet seed layer formed on the lower electrode;
a ceramic piezoelectric thin film formed on the two-dimensional perovskite nanosheet seed layer; and
an upper electrode formed on the ceramic piezoelectric thin film,
wherein each of the two-dimensional perovskite nanosheet seed layer and the ceramic piezoelectric thin film has a crystal structure, and
wherein the two-dimensional perovskite nanosheet seed layer is a layer of a material selected from the group consisting of at least one selected from the group consisting of $MnO_2$, $Mn_3O_7$, $LaNb_2O_7$, $La_{0.90}Eu_{0.05}Nb_2O_7$, $Eu_{0.56}Ta_2O_7$, $SrTa_2O_7$, $Bi_2SrTa_2O_9$, $Ca_2Nb_3O_{10}$, $Sr_2Nb_3O_{10}$, $NaCaTa_3O_{10}$, $CaLaNb_2TiO_{10}$, $La_2Ti_2NbO_{10}$, $Ba_5Ta_4O_{15}$, $W_2O_7$, $RuO_{2.1}$, $Cs_4W_{11}O_{36}$, $TiNbO_5$, $Ti_2NbO_7$, and $TiTaO_5$.

8. The piezoelectric sensor according to claim 7, wherein a lattice parameter difference between the two-dimensional perovskite nanosheet seed layer and the ceramic piezoelectric thin film is 0% to 20%.

9. The piezoelectric sensor according to claim 7, wherein a material of the lower electrode material and a material of the upper electrode are at least one selected from the group consisting of platinum (Pt), gold (Au), palladium (Pd), copper (Cu), nickel (Ni), chromium (Cr), molybdenum (Mo), aluminum (Al), a conductive carbon tape, and a transparent conductive oxide.

* * * * *